US012609509B2

(12) United States Patent
Ma et al.

(10) Patent No.: US 12,609,509 B2
(45) Date of Patent: Apr. 21, 2026

(54) TOPOLOGICAL BULK LASER AND METHOD BASED ON BAND INVERSION AND REFLECTION OF OPTICAL FIELD

(71) Applicant: Peking University, Beijing (CN)

(72) Inventors: Renmin Ma, Beijing (CN); Zengkai Shao, Beijing (CN); Huazhou Chen, Beijing (CN)

(73) Assignee: Peking University, Beijing (CN)

( * ) Notice: Subject to any disclaimer, the term of this patent is extended or adjusted under 35 U.S.C. 154(b) by 990 days.

(21) Appl. No.: 17/769,806

(22) PCT Filed: Mar. 9, 2020

(86) PCT No.: PCT/CN2020/078380
§ 371 (c)(1),
(2) Date: Apr. 18, 2022

(87) PCT Pub. No.: WO2021/109350
PCT Pub. Date: Jun. 10, 2021

(65) Prior Publication Data
US 2022/0352691 A1 Nov. 3, 2022

(30) Foreign Application Priority Data

Dec. 6, 2019 (CN) .......................... 201911240265.8

(51) Int. Cl.
*H01S 5/065* (2006.01)
*H01S 5/04* (2006.01)
(Continued)

(52) U.S. Cl.
CPC ........... *H01S 5/0653* (2013.01); *H01S 5/041* (2013.01); *H01S 5/042* (2013.01); *H01S 5/11* (2021.01); *H01S 5/183* (2013.01)

(58) Field of Classification Search
CPC . H01S 5/065–0658; H01S 5/041–0428; H01S 5/11; H01S 5/18–18397
See application file for complete search history.

(56) References Cited

U.S. PATENT DOCUMENTS 5,048,037 A * 9/1991 Arimoto ............... H01S 5/2232
372/45.01
9,735,545 B1 * 8/2017 Chen .................... H01S 5/18308
(Continued)

FOREIGN PATENT DOCUMENTS

CN 101867153 A * 10/2010
JP 2007234721 A * 9/2007
WO WO-2010113774 A1 * 10/2010 ............... H01S 5/18

OTHER PUBLICATIONS

Barik et al.; New J. Phys. 18, p. 113013 (Year: 2016).*
Barik et al.; New J. Phys. 18, p. 113013, 2016 (Year: 2016).*

*Primary Examiner* — Minsun O Harvey
*Assistant Examiner* — Fernanda Adriana Camacho Alanis
(74) *Attorney, Agent, or Firm* — SV Patent Service

(57) ABSTRACT

A topological bulk laser includes a topological photonic crystal (32) having an energy band inversion between dipole mode and quadrupole mode near the center of Brillouin zone and a trivial photonic crystal (31) not having band inversion for splicing to each other. The reflection and confinement of an optical field occurs at the interface; and the interface encloses to form a closed contour, thereby forming a laser cavity with an effective cavity feedback for lasing at the interior of the interface. This band-inversion-induced reflection mechanism induces single-mode lasing with directional vertical emission. At room temperature, the topological bulk laser can achieve low threshold, narrow linewidth, and a high side-mode suppression ratio, reduce the fabrication
(Continued)

difficulty and costs, and improve heat dissipation and electrical injection efficiency, hence improving lifetime and stability of devices.

6 Claims, 14 Drawing Sheets

(51) Int. Cl.
*H01S 5/042* (2006.01)
*H01S 5/11* (2021.01)
H01S 5/183 (2006.01)

(56) References Cited

U.S. PATENT DOCUMENTS

| | | | |
|---|---|---|---|
| 11,283,244 B2* | 3/2022 | Segev | H01S 5/041 |
| 2005/0201437 A1* | 9/2005 | Reid | H01S 5/12 |
| | | | 372/43.01 |
| 2009/0232176 A1* | 9/2009 | Lipson | H01S 5/18319 |
| | | | 372/99 |
| 2019/0273360 A1* | 9/2019 | Kawashima | G02B 5/0833 |
| 2022/0173574 A1* | 6/2022 | Kante | H01S 5/1075 |

* cited by examiner (a)

Normal unit cell (b)

Figure 2

Trivial band
(Shrunken)

Topological band
(Expanded)

(a)

Dipole (*p*) mode

Quadrupole (*d*) mode (b)

(a)                                (b)

(a)

(b)

(c)

(a)

(b)

Spontaneous emission (a)

Lasing emission (b)

(c)

(a)

(b)

TOPOLOGICAL BULK LASER AND METHOD BASED ON BAND INVERSION AND REFLECTION OF OPTICAL FIELD

TECHNOLOGICAL FIELD

The present invention is in the field of semiconductor laser technology, and in particular, to a topological bulk laser based on band-inversion-induced reflection and its method.

BACKGROUND OF THE INVENTION

With the rapid development of semiconductor laser science and related technical breakthroughs, semiconductor lasers having high quality, wide wavelength range and high power are rapidly developed. Their product categories are becoming more abundant. Remarkably, the vertical-cavity surface-emitting lasers (VCSELs) have the advantages of small size, long lifetime, high brightness, easy to large-scale integration, which have been widely used in laser printing, laser display, industrial sensing, and medical diagnosis. In recent years, the semiconductor lasers have emerged in the emerging application scenarios of automobiles and consumer electronics terminals, such as face recognition and autonomous vehicles, showing a promising market potential.

VCSEL is a commonly used microcavity laser. It has a sandwich-type structure which is mainly composed of active material and upper/lower distributed Bragg reflectors (DBRs) formed by more than twenty pairs of epitaxial materials. Each DBRs has a high reflection coefficient, forming a vertical microcavity with high quality factor (Q). With the deepening of semiconductor research, the development of material growth, and device packaging technologies, the performances of VCSELs have been greatly improved on the output power, brightness, stability, and lifetime.

However, VCSELs still have many practical issues that need to be solved: (1) in order to increase the single-tube output power, in general, it is necessary to increase the cross-sectional area (emitting area) of the laser emitted from the component. When the emitting area increases to a certain extent, the high-order oscillation mode starts to lase, wherein the multi-mode operation leads to brightness reduction and mode instability. (2) The multilayer DBRs on the upper and lower sides usually cause difficulties in fabrication process and electrical injection of the active layer. Particularly, thicker DBRs are required to provide effective feedback of optical field when the device operates at the long wavelength range. It brings more challenges to the growth process, causes poor heat dissipation, and thus reduces the lifetime of lasers.

SUMMARY OF THE INVENTION

To solve the above described problems, the present application discloses a topological bulk laser based on band-inversion-induced reflection and its method. It adopts a new confinement mechanism of optical field and provides a novel mode selection mechanism, which can increase the emission area and hence the output power of the lasers while maintaining stable single-mode lasing with high directionality.

An object of the present invention is to provide a topological bulk laser based on band-inversion-induced reflection. The topological bulk laser can be electrically injected or optically pumped. The electrically injected laser includes, from bottom to top, an N-type substrate, an N-type contact layer, an N-type confinement layer, an active layer, a P-type confinement layer, and a P-type contact layer. The optically pumped laser includes, from bottom to top, an N-type substrate and an active layer. The presently disclosed topological bulk laser based on band-inversion-induced reflection adopts two-dimensional photonic crystal, including topological photonic crystal and trivial photonic crystal. For electrically injected laser, the topological photonic crystal and trivial photonic crystal are constructed onto the P-type contact layer and partial P-type confinement layer. For optically pumped laser, topological photonic crystal and trivial photonic crystal are constructed onto the active layer.

Topological photonic crystal and trivial photonic crystal consist of multiple unit cells periodically arranged into different honeycomb lattice with the same lattice period. The outer edge of each unit cell is a regular hexagon, and there are six equilateral triangle nanoholes inside with rotationally symmetrical distribution, forming the dipole and quadrupole bulk bands. When the distance between the centers of the six nanoholes and the center of the hexagon is equal to one third of the lattice period, the dipole and quadrupole modes are degenerate at the center of the Brillouin zone since the inter-cell and intra-cell coupling constants are equal, i.e., forming a double-degenerate Dirac-cone type band structure at the Γ point.

The Dirac-cone can be opened when the six nanoholes are shrunk or expanded with the hexagon cell center as the center. When the distance between the center of each nanoholes and the center of the hexagon unit cell is less than one third of the lattice period, there is no band inversion between the dipole and quadrupole modes of the photonic crystals. This band structure is in topologically trivial state, forming trivial photonic crystal. When the distance between the center of each nanoholes and the center of the hexagon unit cell is more than one third of the lattice period, a band inversion of the dipole mode and the quadrupole mode occurs near the center of the Brillouin zone. This band structure is in topological state, forming topological photonic crystal.

Joining the trivial photonic crystal and topological photonic crystal to form an interface in the real space, there arises a new reflection and confinement mechanism which is effective for photon states with frequency close to the center of the Brillouin zone, since the states in the trivial photonic crystal cannot propagate into the topological photonic crystal due to the opposite parities of wavefunctions, and vice versa. Bending the interface to a closed contour, photons with a frequency near the center of the Brillouin zone will be reflected along the internal interface, leading to lasing, thereby forming a laser cavity inside the interface.

For an optically pumped laser, when the pumping light incidents the laser cavity, the band-inversion-induced reflection at the interface only occurs in a small range of wave vectors near the center of the Brillouin zone, i.e., the optical mode with efficient confinement only exists near the center of the Brillouin zone, which limits the number of laser cavity modes that can obtain effective feedback. In addition, the closer the optical mode is to the center of the Brillouin zone, the more effective the reflection and confinement of the optical mode, and thus the higher the quality factor of the mode, and finally realize the single-mode lasing. For electrically injected laser, a voltage is applied to the upper and lower sides of the active layer, and carriers are injected and confined into the active layer, generating optical radiation. The band-inversion-induced reflection at the interface only occurs in a small range of wave vector near the center of the Brillouin zone, i.e., the optical mode with efficient confinement only exists near the center of the Brillouin zone, which limits the number of laser cavity modes that can obtain effective feedback, resulting in single-mode lasing. In addition, band-inversion-induced reflection only occurs near the center of the Brillouin zone, and the optical mode with efficient confinement only exists near the center of the Brillouin zone. These modes have a large momentum component in the direction perpendicular to the plane of laser cavity, and thus have vertical emission characteristics.

For optically pumped laser, a topological photonic crystal and a trivial photonic crystal are constructed on the active layer. The working wavelength of the topological bulk laser ranges from visible, near-infrared, telecommunication band to mid-infrared band, which is related with the gain spectrum of the selected material system. The refractive index of the active material is between 2.5 and 3.5. Its composition contains different elements, such as the GaAs based material system at near-infrared wavelength, and the InGaAs, InGaAsP and InAlGaAs material system at telecommunication band. By adjusting the composition of one or more elements in the material system of the active layer, the gain spectrum and the refractive index of the material can be tuned, thereby tuning the working wavelength of the topological bulk laser.

The structure of the active layer includes, but is not limited to single layer, multiple quantum wells or quantum dots. The refractive index of the upper and lower materials of the active layer is smaller than that of the active layer. If the refractive index of the N-type substrate is more than that of the active layer, part of the substrate under the active layer can be removed, so that the underlying of the active layer is air, thereby strong confinement of optical field in the vertical plane direction can be accomplished.

The period of the two-dimensional photonic crystal (a) is equal to $\lambda/n_{eff}$, where $n_{eff}$ is the effective refractive index of the material, and $\lambda$ is the working wavelength of the topological bulk laser.

Both the upper and lower sides of the active layer in the two-dimensional photonic crystal are low refractive index materials, so the optical field is strongly confined in the vertical plane direction.

The light-emitting area of the topological bulk laser can be increased by adjusting the number of the periodically arranged unit cells in the interior of the laser cavity. It ranges from several $\mu m^2$ to several hundreds of $\mu m^2$, and the output power ranges from 1 mW to 100 mW, which can maintain stable single-mode lasing. The interior of the laser cavity can be set to topological photonic crystal or trivial photonic crystal, provided that the constructed photonic crystals at two sides of the cavity are distinct in topology. When the interior of the cavity is in topological state, the lasing mode is a quadrupole array, which has the characteristics of dark radiation mode and has better field confinement in the vertical direction. When the interior of the cavity is in topologically trivial state, the lasing mode is a dipole array, which is a radiation mode and has better radiation characteristics in the vertical direction. Therefore, the topological bulk laser can be constructed as required. For example, in practice the quality factor of the excitation mode needs to be high, and the spectral linewidth needs to be narrow. It is preferred to set topological photonic crystal to the interior of the cavity and trivial photonic crystal to the exterior of the cavity.

For electrically injected laser, the P-type contact layer is etched through and partly etched to the P-type confinement layer to prevent the etching structure from damaging the active material underlying. The nanoholes of the two-dimensional photonic crystal are filled with dielectric material with a low refractive index, such as silicon oxide. The refractive index of the dielectric material is less than that of the active material. Similarly, a dry etching process is used to partially etch stop the material onto the N-type contact layer, which above the N-type substrate, forming a large mesa that can laterally confine the injected carriers. The closed ring-shaped N-type electrode and P-type electrode surrounding the two-dimensional photonic crystal structures are set on the N-type and P-type contact layer, respectively. The active layer, P-type and N-type confinement layers on the upper and lower sides form a sandwich-type double heterojunction structure. When a voltage is applied between the electrodes, carriers are injected and confined to the active layer to emit light. Single-mode lasing is obtained under this mode selection mechanism.

Another object of the present invention is to provide an implementation method of the topological bulk laser based on band-inversion-induced reflection. It can include the following steps:

1) For electrically injected laser, topological photonic crystal and trivial photonic crystal are constructed by etching through the P-type contact layer and partly etching the P-type confinement layer. For optically pumped laser, topological photonic crystal and topological trivial photonic crystal are constructed by etching the active layer.

2) Topological photonic crystal and trivial photonic crystal consist of multiple unit cells periodically arranged into different honeycomb lattice with the same lattice constant The outer edge of each unit cell is a regular hexagon, there are six rotationally symmetrically distributed equilateral triangular nanoholes inside, forming the dipole and quadrupole energy bands.

3) When the distance between the center of each nanoholes and the center of the hexagonal unit cell is equal to one third of the lattice period, the dipole and quadrupole modes are degenerate at the center of the Brillouin zone since the inter-cell and intra-cell coupling strength are equal, i.e., forming a double-degenerate Dirac-cone type band structure at the Γ point. The Dirac-cone can be opened when the six nanoholes are shrunk or expanded with the hexagon cell center as the center. When the distance between the center of each nanoholes and the center of the hexagon unit cell is less than one third of the lattice period, there is no band inversion between the dipole and quadrupole modes of the photonic crystals. This band structure is in topologically trivial state, forming trivial photonic crystal. When the distance between the center of each nanoholes and the center of the hexagon unit cell is more than one third of the lattice period, a band inversion of the dipole mode and the quadrupole mode occurs near the center of the Brillouin zone. This band structure is in topological state, forming topological photonic crystal.

4) Joining the trivial photonic crystal and the topological photonic crystal together to form an interface at the real space, there arises a new reflection and confinement mechanism effective for photon states with frequency close to the center of the Brillouin zone, since the states in the trivial photonic crystal cannot propagate into the topological photonic crystal due to the opposite parities of wavefunctions, and vice versa. Bending the interface to a closed contour, photons with a frequency near the center of the Brillouin zone will be reflected along the internal interface, leading to lasing, thereby forming a laser cavity inside the interface.

5) For optically pumped laser, when the pumping light incidents the laser resonant cavity, the band-inversion-induced reflection at the interface only occurs in a small range of wave vector near the center of the Brillouin zone, i.e., the optical mode with efficient confinement only exists near the center of the Brillouin zone, which limits the number of laser cavity modes that can obtain effective feedback. In addition, the closer the optical mode is to the center of the Brillouin zone, the more effective the reflection and confinement of the optical mode, and thus the higher the quality factor of the mode, and finally realize the single-mode lasing. For electrical injection laser, a voltage is applied to the upper and lower sides of the active layer, and carriers are injected and confined in the active layer to emission. The band-inversion-induced reflection at the interface only occurs in a small range of wave vector near the center of the Brillouin zone, i.e., the optical mode with efficient confinement only exists near the center of the Brillouin zone, which limits the number of laser cavity modes that can obtain effective feedback, resulting in single-mode lasing.

6) The band-inversion-induced reflection only occurs near the center of the Brillouin zone, and the optical mode with efficient confinement only exists near the center of the Brillouin zone. These modes have a large momentum component in the direction perpendicular to the laser cavity plane, and thus have vertical emission characteristics.

For optically pumped laser, by adjusting the composition of one or more elements in the material system of the active layer, the gain spectrum and the refractive index of the material can be tuned, thereby tuning the operating wavelength of the topological bulk laser.

The topological bulk laser can be constructed as required. When the interior of the cavity is in topological state, the lasing mode is a quadrupole array, which has the characteristics of dark radiation mode and has better field confinement in the vertical direction. When the interior of the cavity is in topologically trivial state, the lasing mode is a dipole array, which is a radiation mode and has better radiation characteristics in the vertical direction.

The present invention proposes a new reflection and confinement mechanism of light underlying the topological band physics, and a design of the present invention method is proposed with the attempt to solve the problems encountered in practical applications.

The advantages of the presently disclosed topological bulk laser based on band-inversion-induced reflection proposed can include: this novel confinement mechanism of light can achieve stable single-mode vertical emission of laser with high directionality, low threshold, narrow linewidth, and high side-mode suppression ratio.

It can help reduce the difficulty and costs of the device fabrication, solve the issue of heat dissipation, and increase electrical injection efficiency, and hence improve the stability and lifetime of devices.

Transferring the mentioned method to an electrically injected material platform, an electrically injected laser with vertical emission, controllable size, high directionality, low threshold, narrow linewidth and high side-mode suppression ratio can be obtained. The disclosed laser and its method can be applied to the fields of optical communication, solid-state light, Lidar, substance detection and medical diagnosis.

BRIEF DESCRIPTION OF THE DRAWINGS

FIG. 1a shows the three-dimensional view. FIG. 1b shows the cross-sectional view. FIG. 1c shows the top view.

FIG. 2a shows the schematic diagram of the splicing topological and trivial photonic crystal. FIG. 2b shows the diagram of the formation of the topological and trivial photonic crystal, respectively. FIG. 2c shows the schematic diagram of the basic band theory for topological and trivial photonic crystal at honeycomb-type lattice.

FIG. 3a shows the schematic diagram of the band-inversion-induced reflection of light. FIG. 3b shows the schematic diagram of electric field distributions of the dipole and quadrupole mode in each unit cell of the topological and trivial photonic crystal.

FIG. 5a shows four bulk band structures of topological and trivial photonic crystals along the wave vector Γ-K and Γ-M directions in the Brillouin zone. FIG. 5b shows the corresponding weight of the quadrupole mode in the four bands.

FIG. 6a shows the SEM image of the laser cavity. FIG. 6b shows the enlarged SEM image of its interface.

FIG. 9a shows the normalized spectra. FIG. 9b shows the input-output curves on linear and log scales. FIG. 9c shows the lasing spectrum.

FIG. 10a shows the emission intensity distribution in real space at pumping power below the lasing threshold. FIG. 10b shows the emission intensity distribution in real space at pumping power above the lasing threshold.

FIG. 11*a* shows the spontaneous emission distribution in momentum space. FIG. 11*b* shows the angle-resolved far-field distribution of lasing emission. FIG. 11*c* shows the angle-resolved intensity profile along the white dashed line in FIG. 11*b*.

FIG. 12*a* shows its three-dimensional view. FIG. 12*b* shows its cross-sectional view.

DETAILED DESCRIPTION OF THE INVENTION

In the following, the present invention will be further explained through specific embodiments in combination with the attached drawings.

Embodiment 1

Figure 1:
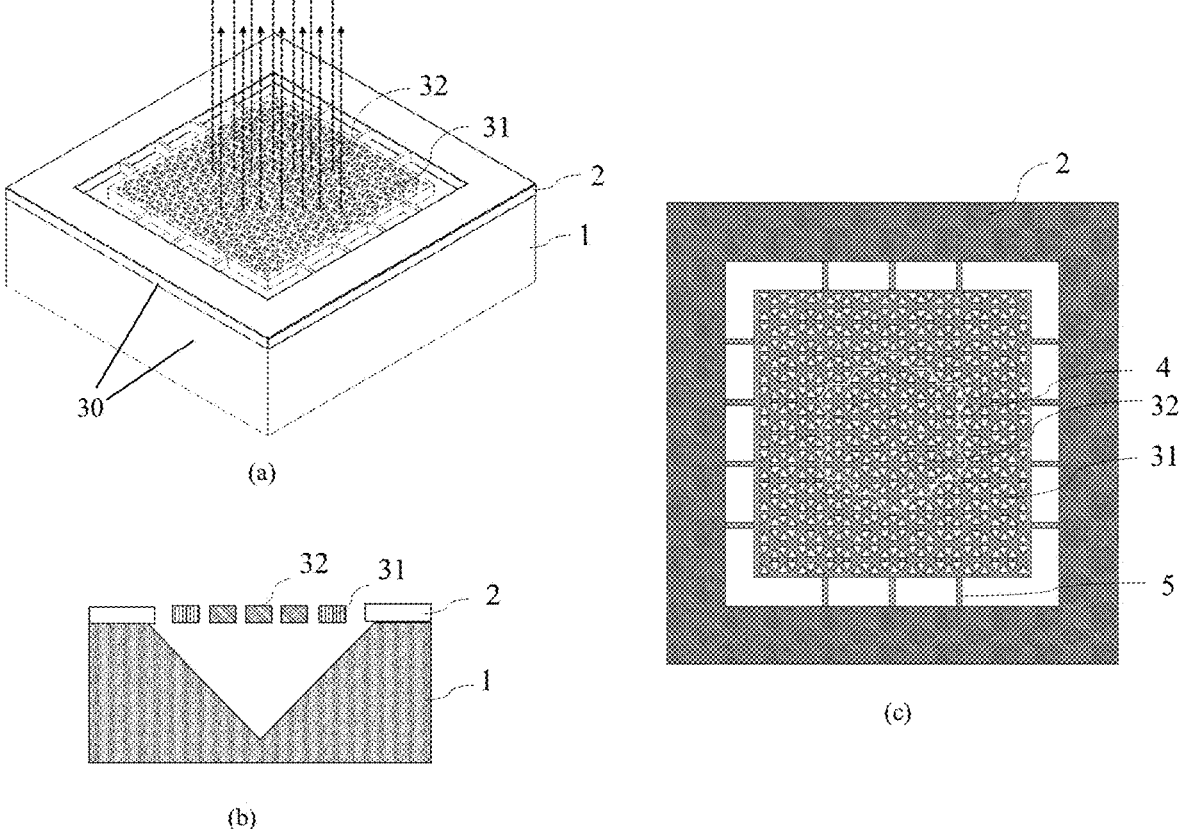
FIGS. 1a-1c illustrate schematic diagrams of the topological bulk laser based on band-inversion-induced reflection according to Embodiment 1 of the present invention.

As shown in FIGS. 1*a*-1*c*, this embodiment adopts optical pumping, and the topological bulk laser based on band-inversion-induced reflection consists of topological photonic crystal and topologically trivial photonic crystal using two-dimensional honeycomb-type photonic crystal. By etching the active layer 2, topological photonic crystal and trivial photonic crystals are constructed. The material of the active layer is a multilayer quantum well structure (such as InGaAsP/InGaAs) grown on a semiconductor substrate 1 (such as InP) by epitaxy growth. The semiconductor substrate 1 and the active layer 2 can form an optically pumped laser 30. By changing the elements and element composition of the active material, the refractive index is optional between 2.5-3.5. The trivial photonic crystal 31 and the topological photonic crystal 32 are spliced together as a whole, forming an interface. Bending the interface to a closed contour, it can form a laser cavity inside the interface. When the laser cavity consists of topological photonic crystal, the lasing mode is a quadrupole array, which has the characteristics of dark radiation mode and has better confinement of optical field in the vertical direction. The upper portion of the active layer is air (refractive index ~1), and the lower layer is removed by wet etching. So, the lower portion of the active layer is also air, so that the optical field is strongly confined in the direction perpendicular to the device plane.

When the pumping light incidents the laser cavity, due to the band-inversion-induced reflection, the emitted light obtains effective feedback in the laser cavity to form a lasing at the working wavelength. In this embodiment, the interface 4 of the laser cavity is a regular hexagon-like contour, and its length of each side is L≈m·a, m is the number of periods of the photonic crystals arranged at the interface, taking 1, 2, 3 . . . , a is the period of the photonic crystals, called lattice constant. The size of the laser area can be increased by increasing the number of unit cells inside the cavity, thereby increasing the light-emitting area, and hence the output power of the laser. In this embodiment, the light-emitting area ranges from several μm² to several hundreds of μm², and the output power ranges from several mW to several hundreds of mW. The photonic crystals arranged outside the laser cavity generally have no less than six periods, which gives a strong confinement of the optical field in the laser cavity.

Figure 2:
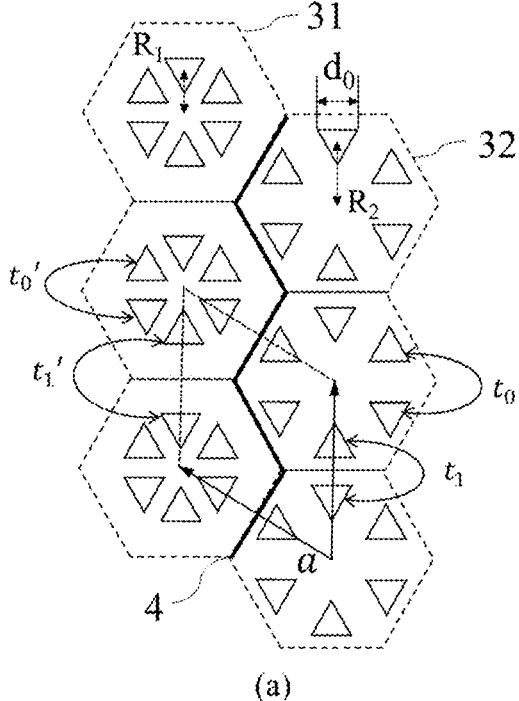
FIGS. 2a-2c are schematic diagrams of the two-dimensional photonic crystal constructed the topological bulk laser based on band-inversion-induced reflection according to Embodiment 1 of the present invention.
Figure 2:
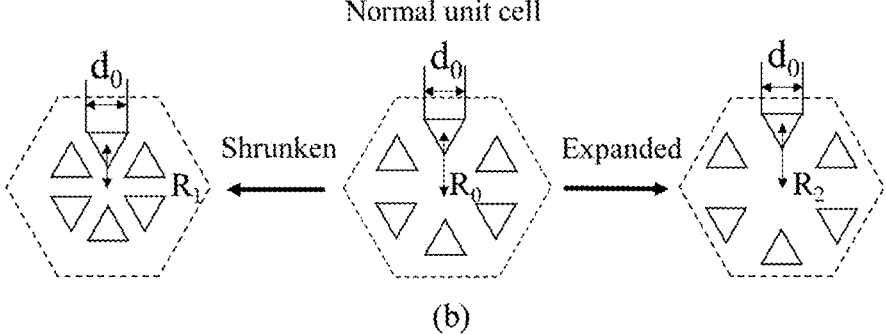

FIG. 2*a* shows the topological photonic crystal and the trivial photonic crystal, respectively. They consist of unit cells periodically arranged into different honeycomb lattice with the same lattice constant. The outer edge of each unit cell is a regular hexagon, and there are six rotationally regular triangular nanoholes inside. For a trivial unit cell, its energy band structure includes the band of dipole (p) mode and quadrupole (d) mode. The energy of d-mode is higher than that of p-mode, as shown in the left figure of FIG. 2*c*. For the periodically arranged unit cells, when the distance between the centers of the six nanoholes and the center of the regular hexagon is equal to one third of the lattice period, the dipole and quadrupole modes are degenerate at the center of the Brillouin zone (Γ point), forming a bulk band structure with a double-degenerate Dirac cone, since the inter-cell coupling strength and the intra-cell coupling strength are equal, i.e. $t_1''=t_0''$.

The Dirac-cone can be opened when the six nanoholes are shrunk or expanded with the hexagon cell center as the center, as shown in FIG. 2*b*. When the distance between the centers of the six nanoholes and the center of the hexagon is less than one third of the lattice period, the intra-cell coupling of unit cells is weaker than the inter-cell coupling within the unit cells, i.e., $t_1'<t_0'$. In this case, the d mode still has higher energy than the p mode, and there is no band inversion between the dipole and quadrupole modes of the photonic crystal. This band structure is called the trivial band, forming a trivial photonic crystal. When the distance between the centers of the six nanoholes and the center of the hexagon is greater than one third of the lattice period, the intra-coupling is stronger than the inter-coupling, i.e., $t_1>t_0$. The p mode has higher energy than the d mode near the center of the Brillouin zone, there occurs the band inversion between the dipole mode and the quadrupole mode. This band structure is called the topological band and forms a topological photonic crystal, as shown in the right picture of FIG. 2*c*. Under the shrinking operation, the preferred distance between the center of the nanoholes and the center of the hexagon ($R_1$) is between 0.91 $R_0$ and 0.98 $R_0$. Under the expansion operation, the preferred distance between the center of the nanoholes and the center of the hexagon ($R_2$) is between 1.02 $R_0$ and 1.09 $R_0$. $R_0$ is the distance between the center of the nanoholes and the center of the hexagon for the normal unit cell.

Figure 3:
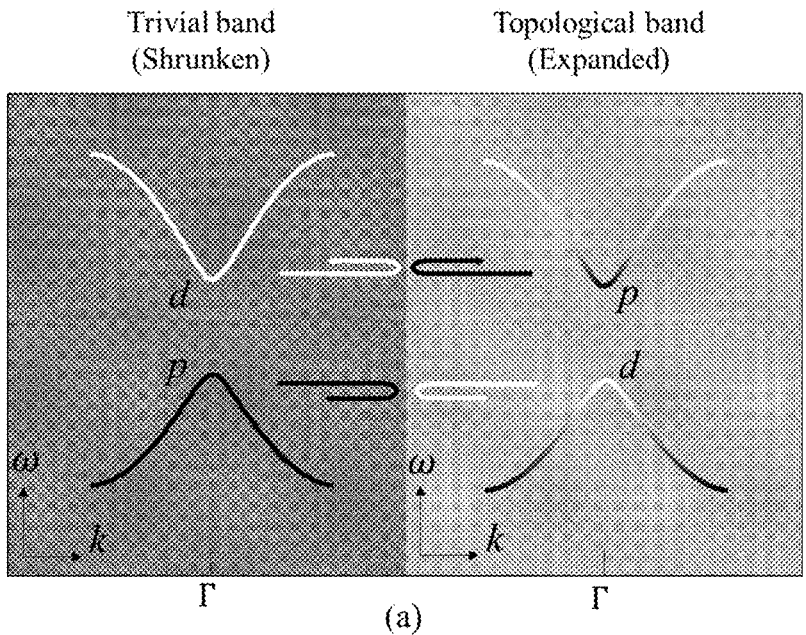
FIGS. 3a and 3b illustrate schematic diagrams of the band-inversion-induced reflection of the present invention.
Figure 3:
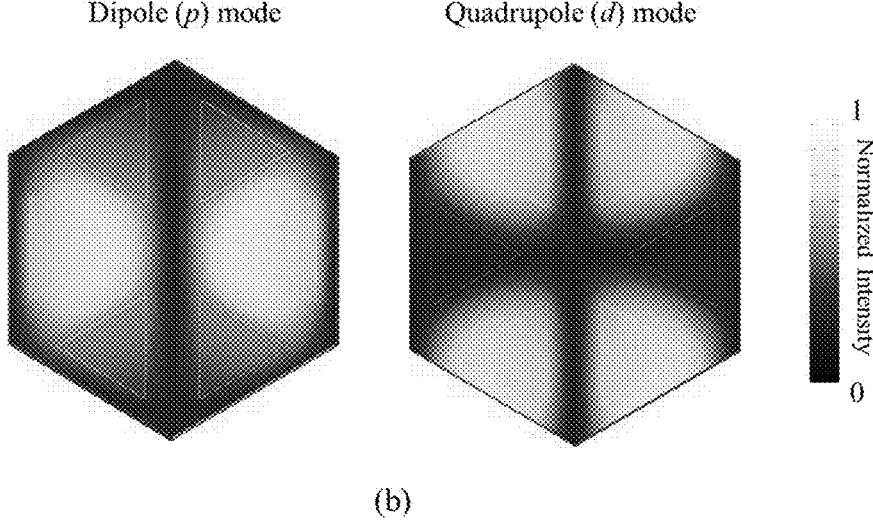
Figure 4:
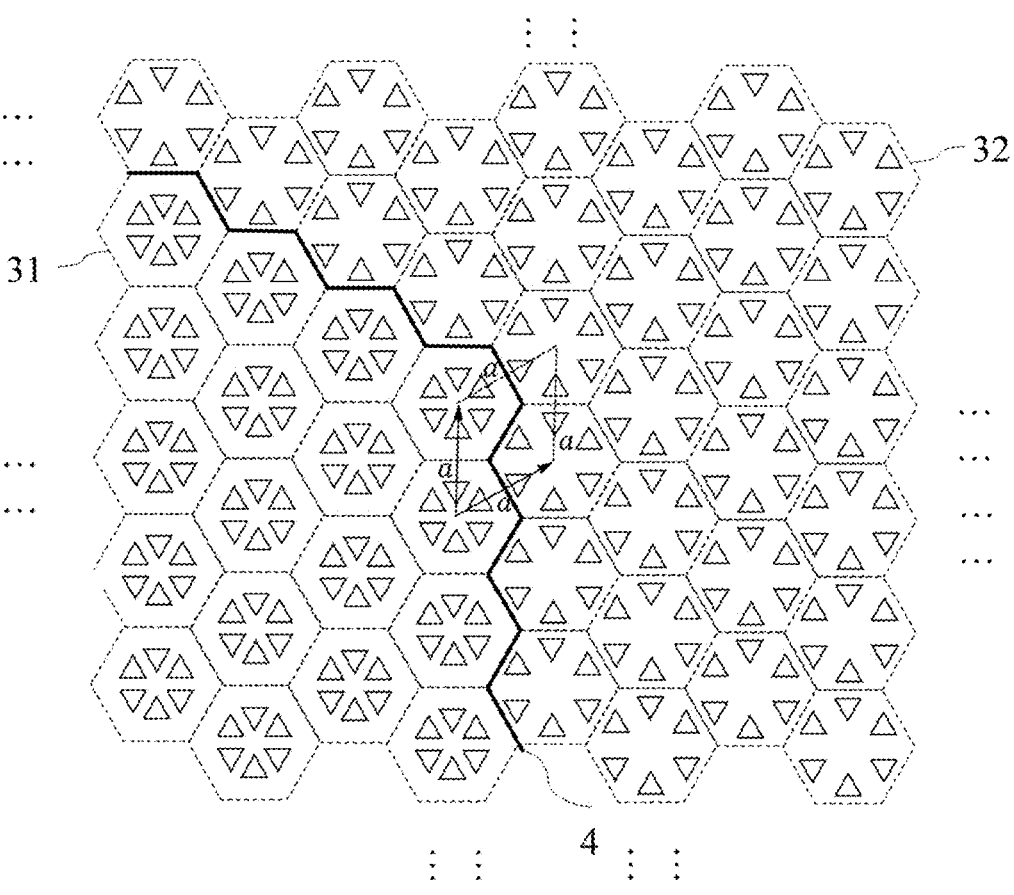
FIG. 4 illustrates schematic diagrams of the cavity interface formed by topological photonic crystal and trivial photonic crystal of the topological bulk laser based on band-inversion-induced reflection of the present invention.

Put these two photonic crystals with different topological states together with the same lattice period (a), the reflection and confinement of the optical field occurs at the interface. FIG. 3*a* is the schematic diagram of the reflection and confinement of the light based on the energy band inversion. The photons with frequency near the Γ point of the lower energy band form a dipole mode in the trivial photonic crystal, and the simulated field distribution is shown in the left picture of FIG. 3*b*. In the topological photonic crystal, it is a quadrupole mode, and the simulated field distribution is shown in the right figure of FIG. 3*b*. When a light wave propagates from one side of the interface to the other, it will be reflected at the interface due to the opposite symmetry of its wave function, and vice versa. Therefore, based on this new reflection mechanism of light, a resonant cavity of topological bulk laser can be formed by slicing the trivial and topological photonic crystals periodically in a two-dimensional plane. The enclosed interface has a corner like 60°, 120°, 240°, and 340°, as shown in FIG. 4. The photon state with its frequency at the edge of the energy band near F point will be reflected back and forth inside the enclosed interface and cannot be transmitted outwards, providing an effective feedback mechanism for lasing.

Figure 5:
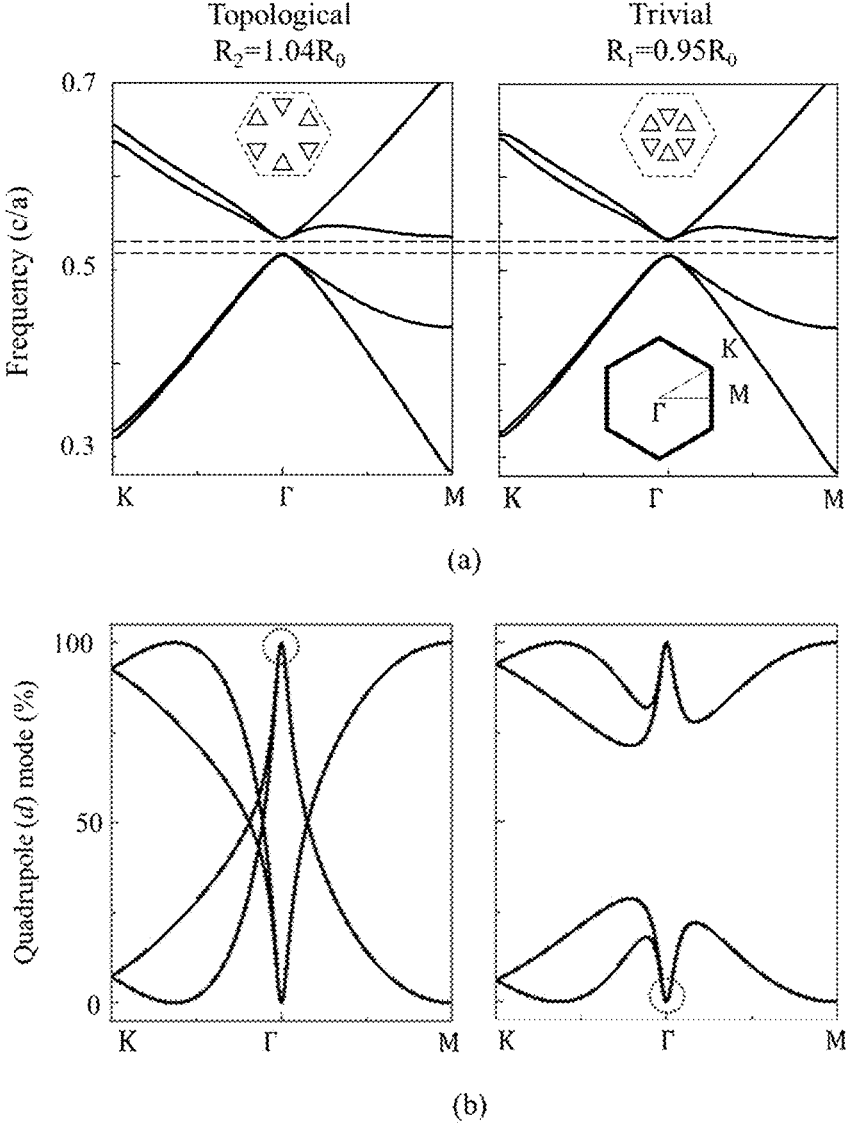
FIGS. 5a and 5b show the band structure of the topological bulk laser based on band-inversion induced reflection according to Embodiment 1 of the present invention.

FIG. 5a shows the four band structures of topological and trivial photonic crystals along the wave vector Γ-K and Γ-M directions in the Brillouin zone. The expansion parameter of topological photonic crystals is $R_2=1.04 R_0$. The shrinking parameter of trivial photonic crystals is $R_1=0.95 R_0$. The preferred deformation parameters in this embodiment make the size and position of the energy band gaps of the two photonic crystals almost coincide, and a better confinement of light can be obtained. The components of the quadrupole mode corresponding to the four energy bands is calculated from the tight-binding model, as shown in FIG. 5b. The two lower energy bands of the topological photonic crystal are pure quadrupole modes (~100%) near the Γ point, as shown by the dotted line in the left image of FIG. 5b, while there are pure dipole modes (~0%) for the trivial photonic crystal, which is consistent with the above analysis.

Figure 6:
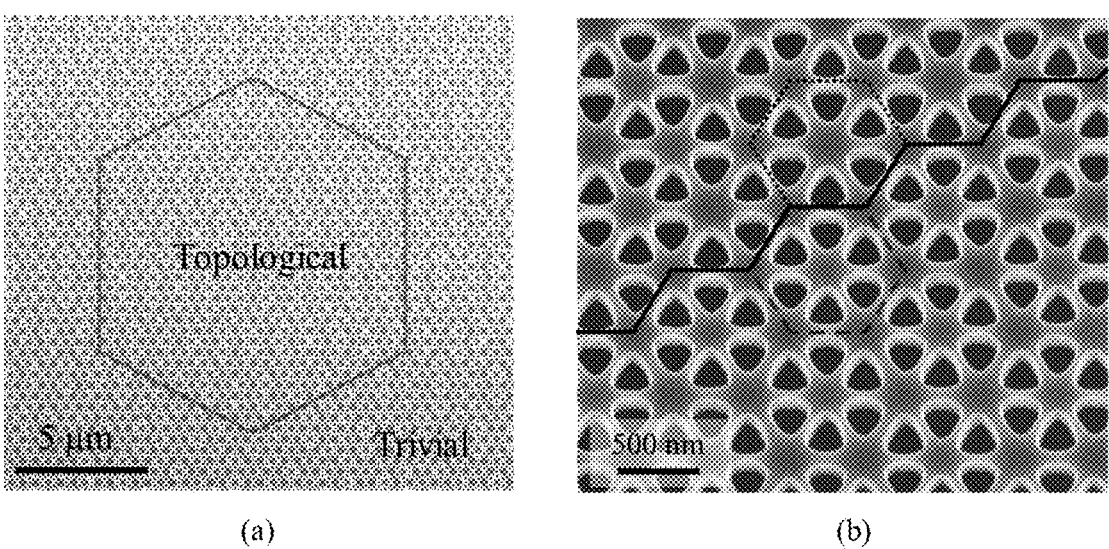
FIGS. 6a and 6b are scanning electron microscope (SEM) images of a fabricated topological bulk laser based on band-inversion-induced reflection according to Embodiment 1 of the present invention.
Figure 7:
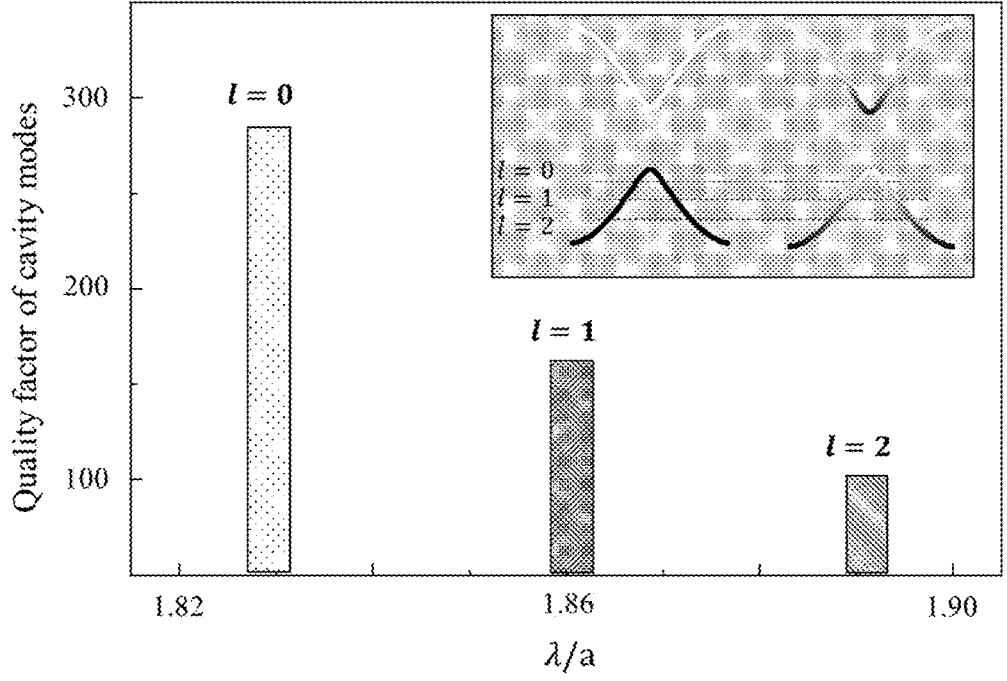
FIG. 7 shows quality factors of the cavity modes with orders of l=0, 1, 2, supported by the laser cavity of the topological bulk laser based on band-inversion-induced reflection according to Embodiment 1 of the present invention.
Figure 8:
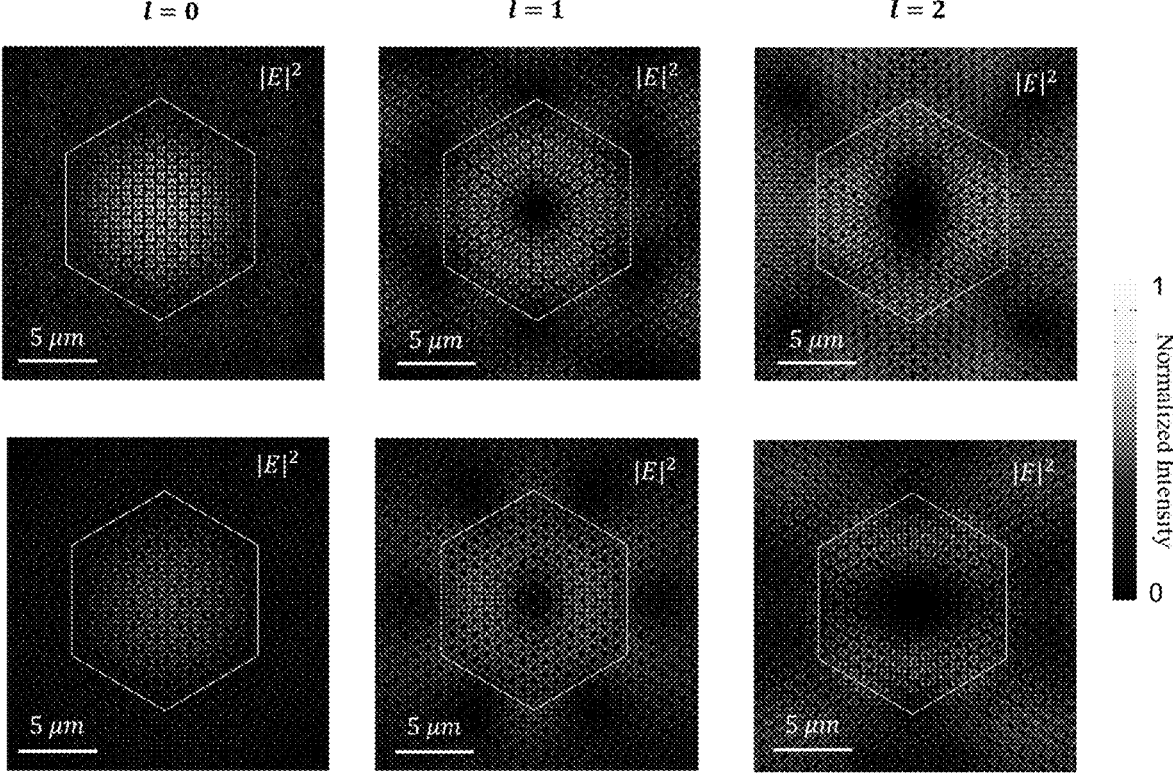
FIG. 8 illustrates electric field distributions of the modes with order of l=0, 1, 2, supported by the laser cavity of the topological bulk laser based on band-inversion-induced reflection according to Embodiment 1 of the present invention.

FIG. 6 shows the scanning electron microscope (SEM) image of the topological bulk laser resonator and the enlarged SEM image at the interface The active material used here is InGaAsP multiple quantum wells epitaxially grown on an InP substrate, and its gain spectrum is range from 1400 to 1600 nm. In this embodiment, the interior of the laser cavity is topological photonic crystal, and its exterior is trivial photonic crystal, forming a regular hexagonal interface. The lattice period is set to be a=820 nm, and the number of periods on each side is 9, so that the side length is L~9a. The quality factors of the modes with different orders (l) in the laser cavity are calculated by full-wave simulation. FIG. 7 and FIG. 8 show the quality factors of the degenerate modes with l=0, 1, 2 and their electric field distribution in the laser cavity. Among them, the two degenerate modes with l=0 have the highest quality factor, and the best confinement of light in the laser cavity. As the mode with larger order is far away from the Γ point, its quality factor is smaller, and the light confinement is weaker.

The band inversion-induced reflection occurs in a small range of wave vectors near the center of the Brillouin zone, so that the effective confinement of mode only exists near the center of the Brillouin zone. This feature firstly limits the number of resonator modes that can obtain effective feedback. Secondly, the closer the frequency of light is to the center of the Brillouin zone, the more effective the reflection and confinement of the light, and the higher quality factor, which is contribute to the realization of single-mode lasing. This characteristic is independent of the size of the laser cavity. In this embodiment, the circumference of the laser cavity is more than 40 μm. For traditional laser with the same size, though, there are dozens of modes with different orders, and the values of their quality factors are almost equal. Therefore, it is difficult to achieve stable single-mode lasing, due to the lack of an internal mode selection mechanism. The resonant mode numbers of the topological laser of the invention do not depend on the size of the resonant cavity, and do not need a complex mode selection mechanism to maintain a stable single-mode emission while increases the emitting area of the device and hence the output power.

Figure 9:
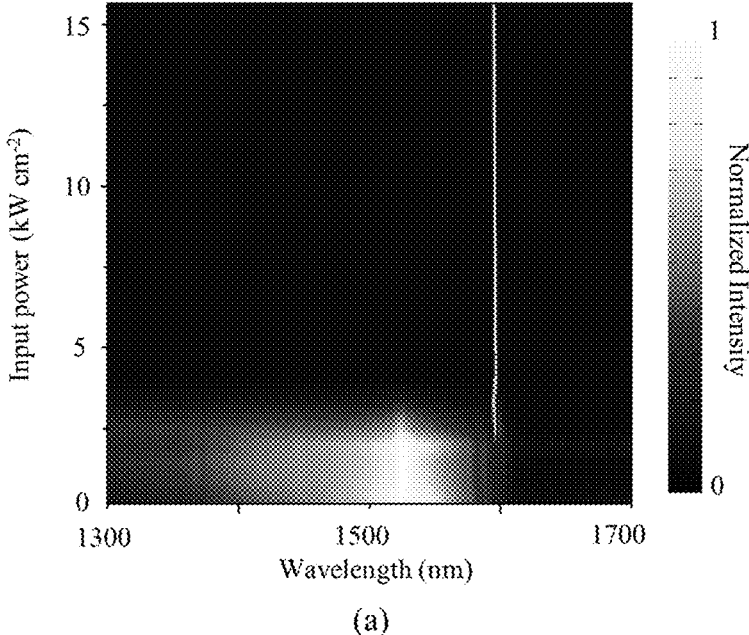
FIGS. 9a-9c show experimental results of the topological bulk laser based on band-inversion-induced reflection at various pump powers according to Embodiment 1 of the present invention.
Figure 9:
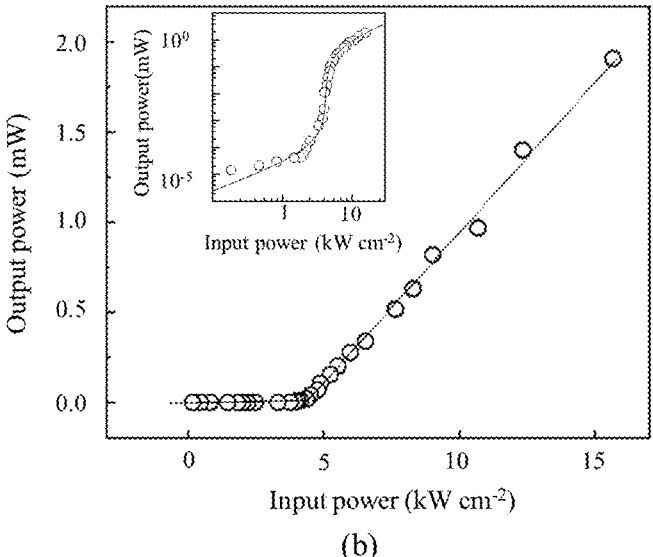
Figure 9:
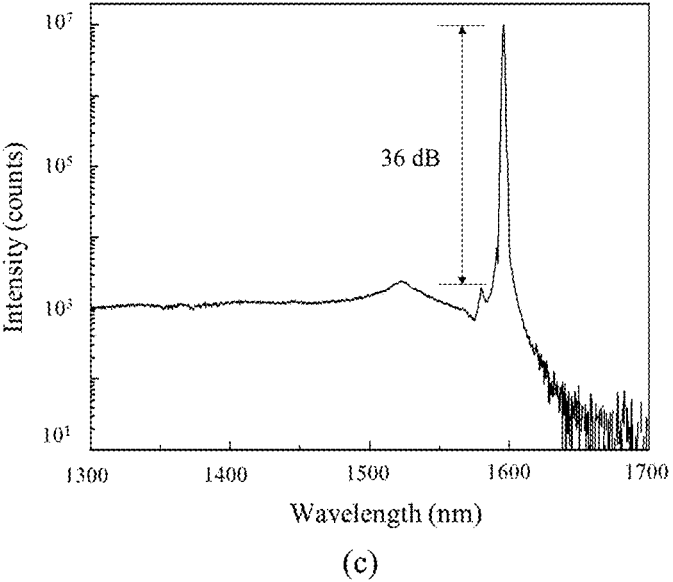

As shown in FIG. 9a, when the pumping power is above the laser threshold $P_{th}$, single-mode lasing occurs in the laser cavity. FIG. 9b is the linear relationship between the output optical power and the pumping power obtained in the experiment, and the inset figure is the curve under the log coordinate. It can be clearly seen that a transition from spontaneous emission to stimulated emission (lasing), and the "S"-shaped curve under the log coordinate can be verified that as the pump power increases, the cavity mode has entered the lasing state. The measured threshold $P_{th}$ of the topological bulk laser is as low as ~4.5 kW cm$^{-2}$, which is comparable to that of the state art of the commercial laser diodes. the lasing spectrum under semi-log coordinates is shown in FIG. 9c under the pumping power of $2P_{th}$. The side-mode suppression ratio of this topological bulk laser with single-mode lasing is about 36 dB. Through a high-precision spectrometer, the linewidth of the lasing mode is about 0.25 nm. This narrow linewidth is comparable to the spectral linewidth that of the state art of the laser diode with similar cavity size.

Figure 10:
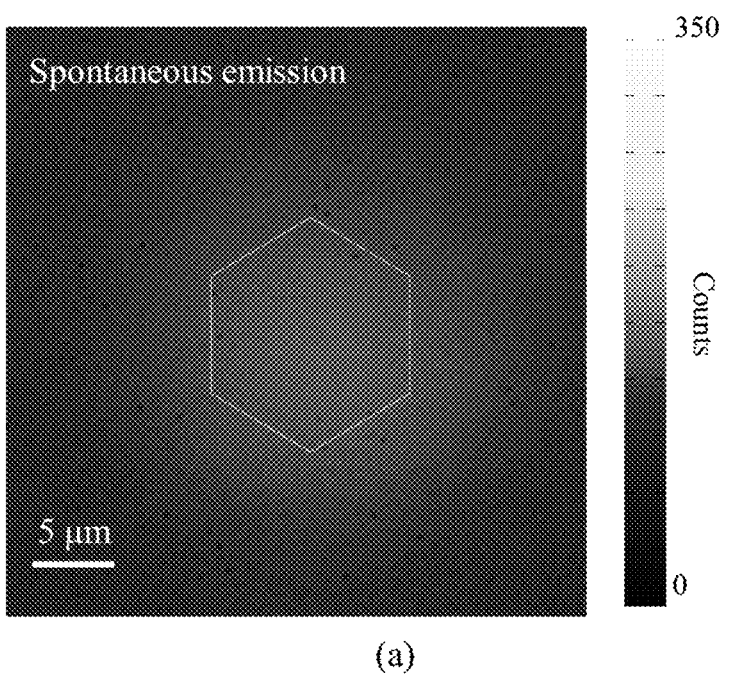
FIGS. 10a and 10b show the emission intensity distribution in real-space of the l=0 mode of the topological bulk laser based on band-inversion-induced reflection according to Embodiment 1 of the present invention.
Figure 10:
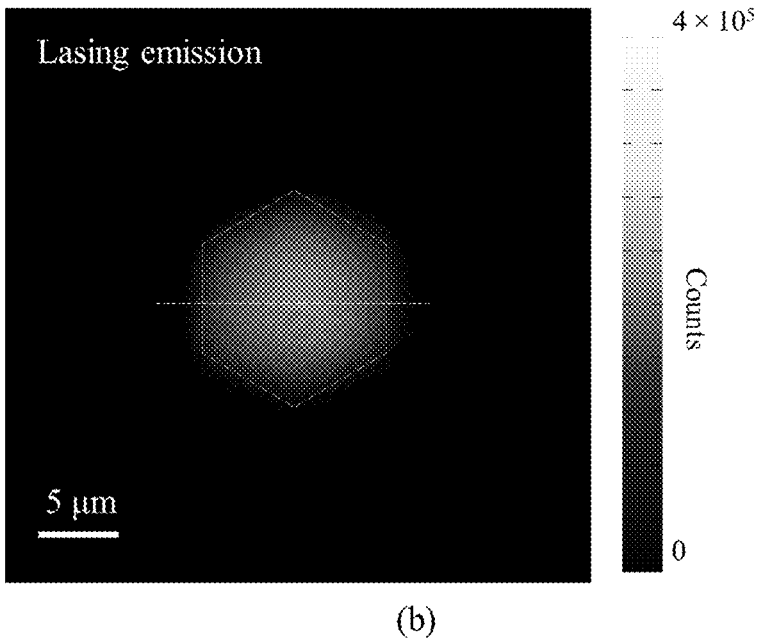

The transition from spontaneous emission to stimulated emission of the topological bulk laser of the above embodiment can also be observed in its real space, as shown in FIG. 10. When the pumping power is below the lasing threshold, the laser has a uniform distribution throughout the active layer shown in FIG. 10a. When the pumping power is above the lasing threshold, from the FIG. 10b, we can see that the near field of the excited mode is strongly confined to the interior of the cavity. By comparing with the simulation results, it is verified that the excited mode is l=0 mode with the highest quality factor shown in FIG. 7 and FIG. 8.

Figure 11:
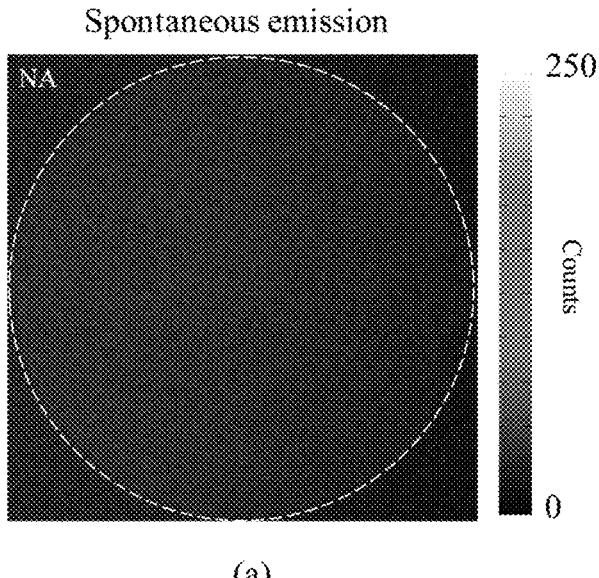
FIGS. 11*a*-11*c* shows far-field distributions of the l=0 lasing mode of the topological bulk laser based on band-inversion-induced reflection according to Embodiment 1 of the present invention.
Figure 11:
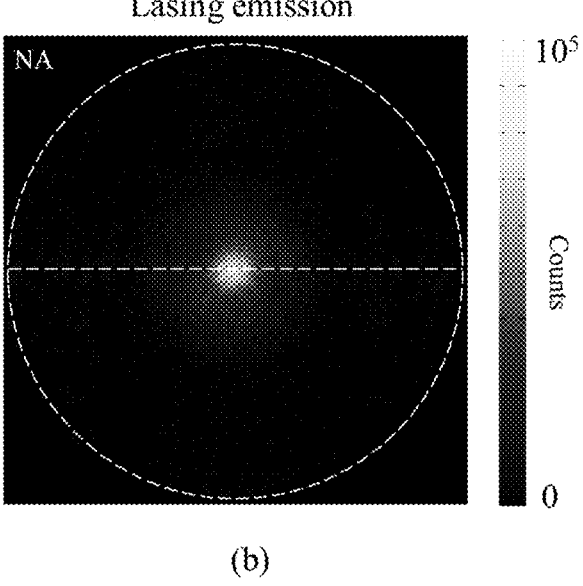
Figure 11:
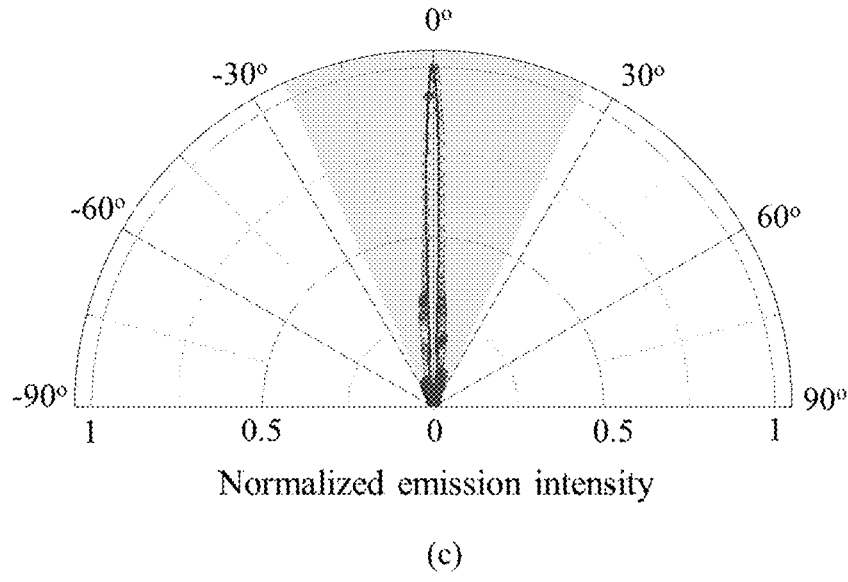

FIG. 11 shows the far-field distribution of the topological bulk laser with l=0 below and above the lasing threshold in the embodiment. In the case of spontaneous emission below the threshold, the excited mode radiation has no directionality and exhibits a uniform intensity distribution in the momentum space, as shown in FIG. 11a. The dotted circle represents the numerical aperture of the collection objective (NA=0.42). In the case of lasing, its emission direction is mainly concentrated in the direction perpendicular to the plane of the cavity, and the intensity distribution presents a small spot in the momentum space. The measured divergence angle is less than 6°, as shown in FIG. 11b. Following the dotted line in FIG. 11b gives the angular resolved energy distribution corresponding to its momentum space, marked by circles in FIG. 11c. Fourier transform operation was applied to the intensity distribution along the dotted line in FIG. 10b to obtain its corresponding simulated angular resolved distribution, shown in the black curve in FIG. 11c. The experimental results are in good agreement with the simulated results.

Through the analysis of the experimental results of an embodiment, the advantages of the topological bulk laser based on the band-inversion-induced reflection proposed by the present invention can be demonstrated: the novel confinement mechanism of light has contributed to realizing single-mode lasing emission with high directionality, low threshold, narrow linewidth, and high side-mode suppression ratio.

Embodiment 2

Figure 12:
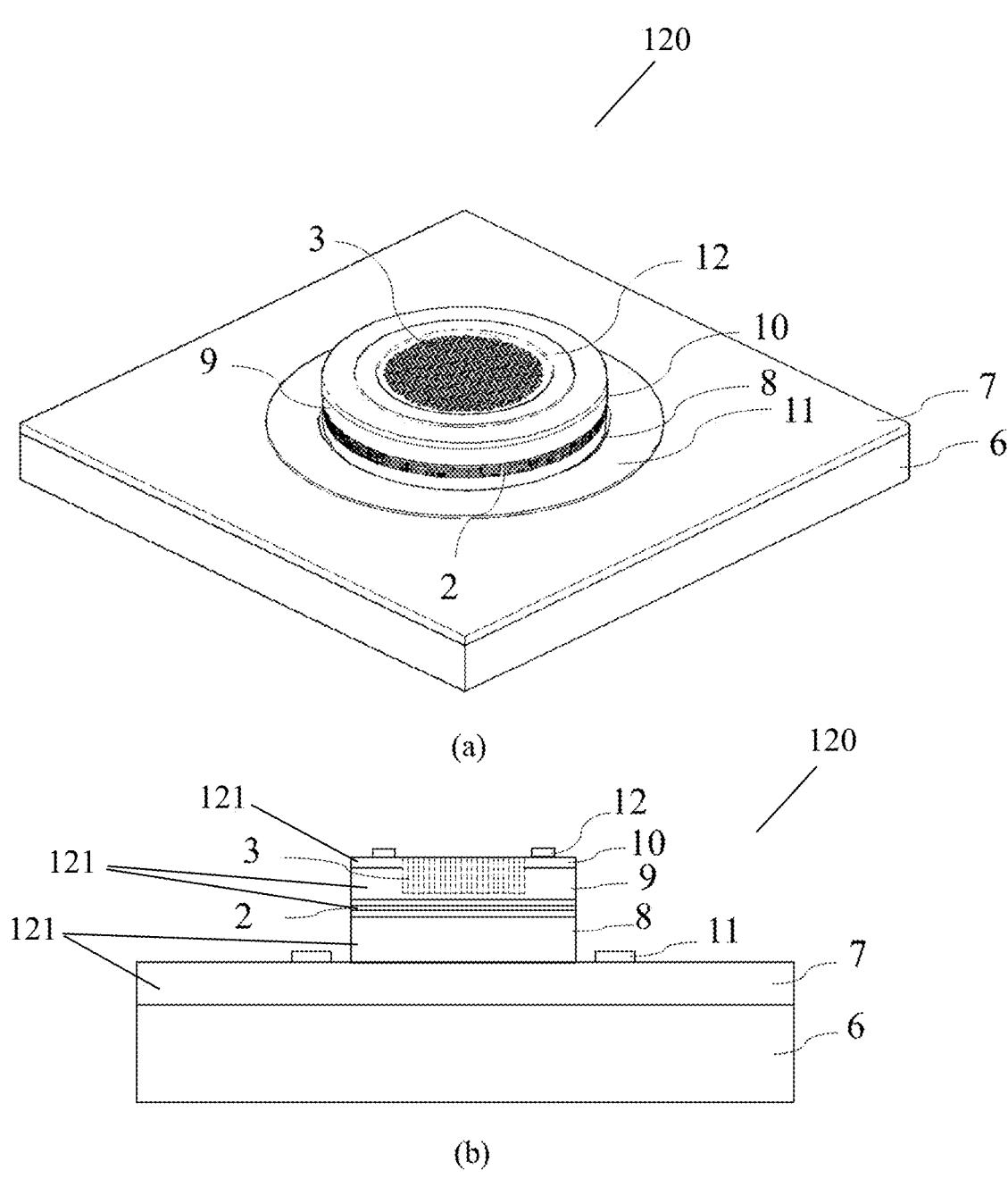
FIGS. 12*a* and 12*b* illustrate schematic diagrams of an electrically injected topological bulk laser based on band-inversion-induced reflection according to Embodiment 2 of the present invention.

As shown in FIG. 12(a) and FIG. 12(b), this embodiment adopts an electrically injected surface-emitting topological bulk laser. Take the design method of the topological bulk laser based on band inversion induced reflection in Embodiment 1 to the electrical injection material systems, a practical electrically injected surface-emitting laser with controllable size, high directionality, low threshold, narrow linewidth, and high side-mode suppression ratio can be obtained.

A topological bulk laser 120 includes a semiconductor epitaxial layer which consists of an N-type substrate 6, an N-type contact layer 7 located on the N-type substrate, N-type confinement layer 8, active layer 2 located on the N-type confinement layer, P-type confinement layer 9 located on the active layer, P-type contact layer 10 located on the P-type confinement layer. In the topological bulk laser 120, an electrically injected laser 121 can be formed by the N-type contact layer 7, the N-type confinement layer 8, the active layer 2, the P-type confinement layer 9, and the P-type contact layer 10. The refractive index of the N-type and P-type material is slightly smaller than that of the active layer, and the refractive index difference is optional between 0.2 and 0.5. On the epitaxial layer, the P-type contact layer 10, the P-type confinement layer 9, the active layer 2 and the N-type confinement layer 8 are etched by a dry etching process and stopped on the N-type contact layer 7 to form a large device platform, which limits the injected carriers laterally. The topological and trivial photonic crystals 3 in the topological bulk laser are arranged above the active layer 2 through a top-down dry etching process to protect the active layer from etching damage. The etched photonic crystal structures are filled with dielectric materials with low refractive index (such as silicon oxide, silicon nitride, etc.) in the subsequent process step.

A closed ring-shaped N-type electrode 11 and a P-type electrode 12 surrounding the photonic crystal structures are arranged on the N-type contact layer 7 and the P-type contact layer 10, respectively. The active layer, the upper P-type confinement layers and the lower N-type confinement layers form a sandwich-type double heterojunction structure. When a voltage is applied between the electrodes, carriers are injected and confined into the active layer, generating optical radiation, and the electrical field component of the excited mode is coupled to the laser resonator set on the upper side. Based on the effective feedback provided by the band-inversion-induced reflection of light, a stable single-mode lasing can also be achieved under the mode selection mechanism mentioned above.

Finally, it should be noted that the disclosure of those embodiments is intended to facilitate further understanding of the present invention, but that those skilled in the field can understand that various substitutions and modifications are possible without leaving the spirit and scope of the invention and the attached claims. Therefore, the invention shall not be limited to the contents disclosed by the embodiments, and the scope of protection claimed by the present invention is subject to the scope defined by the claims.

What is claimed is:

1. A topological bulk laser based on reflection of optical field induced by band inversion, comprising:
   an N-type contact layer; an N-type confinement layer; an active layer; a P-type confinement layer; and a P-type contact layer, wherein the N-type contact layer, the N-type confinement layer, the active layer, the P-type confinement layer, and the P-type contact layer are configured to form an electrically injected laser;
   an N-type substrate;
   a topological bulk laser cavity constructed by two-dimensional photonic crystals with distinct topology including a topological photonic crystal and a topologically trivial photonic crystal,
   a ring-shaped N-type electrode on the N-type contact layer, wherein the ring-shaped N-type electrode is surrounding the two-dimensional photonic crystals; and
   a P-type electrode on the P-type contact layer,
   wherein the topological bulk laser is electrically injected, wherein for the electrically injected laser, the photonic crystals are formed on the P-type contact layer and partial P-type confinement layer,
wherein the topological photonic crystal and trivial photonic crystal include multiple unit cells periodically arranged into different honeycomb-type lattice with a same lattice period, wherein an outer edge of each unit cell is a regular hexagon comprising six nanoholes, forming two bulk bands of a dipole and a quadrupole mode, wherein when a distance between centers of the six nanoholes and a center of the hexagon is equal to one third of a lattice period, the dipole and quadrupole modes are degenerate at a center region of a Brillouin zone since the inter-cell and intra-cell coupling strength are equal, forming a double-degenerate Dirac-cone type band structure at the F point,
wherein the double-degenerate Dirac-cone type band structure is opened when the six nanoholes are shrunk or expanded with the center of hexagon unit cell as the center, wherein when the distance between the center of each nanoholes and the center of the hexagon unit cell is less than one third of the lattice period, there is no band inversion between the dipole and quadrupole modes of the photonic crystal, forming a trivial photonic crystal having the double-degenerate Dirac-cone type band structure in a topologically trivial state,
wherein a distance between a center of each of the nanoholes and the center of the hexagon unit cell is more than one third of the lattice period, a band inversion between the dipole mode and the quadrupole mode occurs in the center region of the Brillouin zone, forming the topological photonic crystal having the double-degenerate Dirac-cone type band structure in a topological state,
wherein the trivial photonic crystal and the topological photonic crystal are combined to form an interface, which produces a new reflection and confinement mechanism which is effective for photon states with frequency in the center region of the Brillouin zone, since states in the trivial photonic crystal are prohibited from propagating into the topological photonic crystal due to the opposite parities of wavefunctions, and vice versa, wherein the interface is bent to form a closed contour, photons with a frequency in the center region of the Brillouin zone is reflected along the internal interface, leading to simulated emission, thereby forming the topological bulk laser cavity inside the interface,
wherein for the electrically injected laser, the voltage is applied across the active layer, carriers are injected and confined into the active layer, generating optical radiation, wherein a band-inversion-induced reflection at the interface only occurs in a small range of wave vector in the center region of the Brillouin zone, which produces an optical mode with efficient confinement only exists in the center region of the Brillouin zone, which limits the number of laser cavity modes to receive feedback, resulting in single-mode lasing,
wherein the band-inversion-induced reflection only occurs in the center region of the Brillouin zone, which produces an optical mode with efficient confinement only exists in the center region of the Brillouin zone, wherein the modes have a large momentum component perpendicular to the interface of the topological bulk laser cavity, and thus have vertical emission characteristics.

2. The topological bulk laser of claim 1, wherein the N-type contact layer, the N-type confinement layer, the P-type confinement layer, and the P-type contact layer above or below the active layer have refractive indices lower than the active layer.

3. The topological bulk laser of claim 1, wherein the lattice period of the two-dimensional photonic crystals is $\lambda/n_{eff}$, $n_{eff}$ is an effective refractive index and $\lambda$ is an operating wavelength of the topological bulk laser.

4. The topological bulk laser of claim 1, wherein the active layer for the electrically pumped laser has a refractive index from 2.5 to 3.5.

5. The topological bulk laser of claim 1, wherein for the electrically injected laser, a gain spectrum and a refractive index of the active layer are tuned by adjusting a composition in the active layer, thereby tuning an operating wavelength of the topological bulk laser.

6. The topological bulk laser of claim 1, wherein the nanoholes of the two-dimensional photonic crystal are filled with a dielectric material having a refractive index less than an active material in the active layer.

\* \* \* \* \*